United States Patent
Chang et al.

(10) Patent No.: US 8,947,905 B2
(45) Date of Patent: Feb. 3, 2015

(54) NONVOLATILE MEMORY DEVICES AND METHODS OF DRIVING THE SAME

(75) Inventors: Man Chang, Seongnam-si (KR); Young-bae Kim, Seoul (KR); Dong-soo Lee, Gunpo-si (KR); Chang-bum Lee, Seoul (KR); Seung-ryul Lee, Seoul (KR); Chang-jung Kim, Yongin-si (KR); Myoung-jae Lee, Hwaseong-si (KR); Kyung-min Kim, Goyang-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 406 days.

(21) Appl. No.: 13/523,429

(22) Filed: Jun. 14, 2012

(65) Prior Publication Data

US 2013/0051164 A1     Feb. 28, 2013

(30) Foreign Application Priority Data

Aug. 22, 2011  (KR) ......................... 10-2011-0083580

(51) Int. Cl.
   G11C 11/00    (2006.01)
   G11C 11/56    (2006.01)
   G11C 13/00    (2006.01)

(52) U.S. Cl.
   CPC ........ G11C 11/5685 (2013.01); G11C 13/0007 (2013.01); G11C 13/0064 (2013.01); G11C 13/0069 (2013.01)
   USPC ........... 365/148; 365/158; 365/163; 365/171; 365/173

(58) Field of Classification Search
   CPC ............... G11C 2013/0045; G11C 2013/0052; G11C 11/161; G11C 2013/0078
   USPC .......................... 365/148, 158, 163, 171, 173
   See application file for complete search history.

(56) References Cited

U.S. PATENT DOCUMENTS 6,914,809 B2 *  7/2005  Hilton et al. ................... 365/158
7,609,544 B2   10/2009  Osada et al.
(Continued)

FOREIGN PATENT DOCUMENTS

JP     2006155700 A    6/2006
JP     2009-026364 A   2/2009
(Continued)

OTHER PUBLICATIONS

US Office Action dated May 15, 2013, issued in co-pending U.S. Appl. No. 13/307,672.
(Continued)

*Primary Examiner* — Han Yang
(74) *Attorney, Agent, or Firm* — Harness, Dickey & Pierce, P.L.C.

(57) ABSTRACT

A method of driving a nonvolatile memory device including applying a reset voltage to a unit memory cell, reading a reset current of the unit memory cell, confirming whether the reset current is within a first current range, if the reset current is not within the first current range, changing the reset voltage and applying a changed reset voltage or applying again the reset voltage to the unit memory cell after applying a set voltage to the unit memory cell, if the reset current is within the first current range, confirming whether a difference between the present reset current and an immediately previous set current is within a second current range, and, if the difference is not within the second current range, applying the reset voltage or applying again the reset voltage to the unit memory cell after applying a set voltage to the unit memory cell.

22 Claims, 12 Drawing Sheets

(56) References Cited

U.S. PATENT DOCUMENTS

| | | |
|---|---|---|
| 7,639,522 B2 | 12/2009 | Cho et al. |
| 7,646,632 B2 | 1/2010 | Philipp et al. |
| 7,978,499 B2 | 7/2011 | Hosono et al. |
| 8,134,866 B2 | 3/2012 | Bae et al. |
| 8,213,213 B2 | 7/2012 | Chang et al. |
| 8,243,542 B2 | 8/2012 | Bae et al. |
| 8,320,171 B2 | 11/2012 | Park |
| 8,351,240 B2 | 1/2013 | Park et al. |
| 2008/0043513 A1 | 2/2008 | Hoenigschmid et al. |
| 2008/0062740 A1 | 3/2008 | Baek et al. |
| 2010/0188885 A1 | 7/2010 | Toda et al. |
| 2011/0051508 A1 | 3/2011 | Eleftheriou et al. |
| 2013/0058153 A1 | 3/2013 | Chang et al. |

FOREIGN PATENT DOCUMENTS

| | | |
|---|---|---|
| JP | 2010-092568 | 4/2010 |
| KR | 20050118331 A | 12/2005 |
| KR | 100755409 B1 | 9/2007 |
| KR | 10-0801082 B1 | 2/2008 |
| KR | 20080085597 A | 9/2008 |

OTHER PUBLICATIONS

US Office Action dated Nov. 7, 2013 in corresponding U.S. Appl. No. 13/590,978.

* cited by examiner

NONVOLATILE MEMORY DEVICES AND METHODS OF DRIVING THE SAME

CROSS-REFERENCE TO RELATED APPLICATION

This application claims priority under 35 U.S.C. §119 to Korean Patent Application No. 10-2011-0083580, filed on Aug. 22, 2011, in the Korean Intellectual Property Office (KIPO), the entire contents of which are incorporated herein by reference.

BACKGROUND

1. Field

Example embodiments relate to nonvolatile memory devices and methods of driving the same.

2. Description of the Related Art

Examples of non-volatile memory include magnetic random access memory (MRAM), a ferroelectric random access memory (FRAM), a phase-change random access memory (PRAM), a resistive random-access memory (RRAM), and the like. An RRAM device is a resistance-change memory device which stores data based on resistance change characteristics, that is, a resistance of a material changed according to an applied current or voltage.

For example, in the RRAM, if a set voltage is applied to a variable resistance material such as TaOx ("Ta" represents tantalum and "O" represents oxygen), the resistance of the variable resistance material is changed from a high-resistance state to a low-resistance state (also referred to as an "ON state"). In addition, if a reset voltage is applied to the variable resistance material, the resistance of the variable resistance material is changed from the low-resistance state to the high-resistance state (also referred to as "OFF state"). The resistance-change memory device may store data by switching between the ON state and the OFF state.

A read voltage, which does not change the resistance of the variable resistance material, may be applied to the variable resistance material when reading recorded data. A unit memory cell of the resistance-change memory device includes a storage node including the variable resistance material layer and a switching device for controlling application of a signal to the storage node. The switching device may control application of various voltages such as the set voltage, the reset voltage, and the read voltage to the storage node.

Recently, a multi level cell (MLC), which may store information including more than 2 bit information as well as single bit information, has been developed by improving the variable resistance material and structure of the unit memory cell. For example, an MLC, which may store two bit information, has one set state (a level "00") and three reset states (levels "01", "10", and "11"). The three reset states have different reset voltages from each other, and the variable resistance material has different resistances in the three reset states. Thus, because a current flowing between the variable resistance material and an electrode varies depending on each of the levels, it is possible to read data stored in the MLC by measuring the current.

SUMMARY

Example embodiments include driving methods for improving current dispersion at each level of a multi-level nonvolatile memory device. Example embodiments include nonvolatile memory devices in which the current dispersion is improved.

According to example embodiments, a method of driving a nonvolatile memory device includes applying a first reset voltage to a unit memory cell and reading the present reset current, comparing the present reset current to a set current of an immediately previous cycle, applying a second reset voltage to the unit memory cell if a difference between the present reset current and the set current of the immediately previous cycle is smaller than a minimum value, and applying again the first reset voltage to the unit memory cell after switching to a set state by applying a set voltage to the unit memory cell, if the difference between the present reset current and the set current of the immediately previous cycle is larger than a maximum value.

The method may further include continuing a next cycle in which a set voltage is applied to the unit memory cell and a set current is read, if the difference between the present reset current and the immediately previous set current is within a current value range. The unit memory cell may include a multi level cell, and the method may further include determining whether the unit memory cell is switched to a desired level state, between the applying the first reset voltage to the unit memory cell and reading the present reset current and the comparing the present reset current to the set current of the immediately previous cycle.

In the applying the first reset voltage to the unit memory cell and reading the present reset current, the first reset voltage may be selected from among three first reset voltages that are different from each other depending on a level state to be switched. The determining whether the unit memory cell is switched to the desired level state may include confirming whether the present reset current is within a current value range corresponding to the desired level state. The method may further include changing the first reset voltage to a third reset voltage and then applying the third reset voltage to the unit memory cell if the present reset current exceeds the current value range corresponding to the desired level state.

The third reset voltage may be equal to or lower than the first reset voltage. The method may further include applying again the first reset voltage to the unit memory cell after switching to the set state by applying the set voltage to the unit memory cell, if the present reset current is smaller than the current value range corresponding to the desired level state. The unit memory cell may include a multi level cell, and the comparing of the present reset current to the set current of the immediately previous cycle may include confirming whether the difference between the present reset current and the immediately previous set current is within one of three current value ranges that are different from each other depending on a level state to be switched. The set current of the immediately previous cycle may be read in an immediately previous set cycle and then stored in a buffer. The second reset voltage may be equal to or lower than the first reset voltage.

According to other example embodiments, a method of driving a nonvolatile memory device includes applying a first set voltage to a unit memory cell and reading the present set current, comparing the present set current to a reset current of an immediately previous cycle, applying a second set voltage to the unit memory cell if a difference between the present set current and the reset current of the immediately previous cycle is smaller than a minimum value, and applying again the first set voltage to the unit memory cell after switching to a reset state by applying a reset voltage to the unit memory cell, if the difference between the present set current and the reset current of the immediately previous cycle is larger than a maximum value.

The method may further include continuing a next cycle in which a reset voltage is applied to the unit memory cell and a reset current is read, if the difference between the present set current and the immediately previous reset current is within a current value range. The unit memory cell may include a multi level cell, and the comparing the present set current to the reset current of the immediately previous cycle may include confirming whether the difference between the present set current and the immediately previous reset current is within one of three current value ranges that are different from each other depending on a level state of the immediately previous cycle. The second set voltage may be equal to or lower than the first set voltage. The reset current of the immediately previous cycle may be read in the immediately previous reset cycle and then stored in a buffer.

According to still other example embodiments, a nonvolatile memory device includes a memory cell array including a plurality of unit memory cells arranged in a matrix shape including rows and columns, a row decoder for sequentially activating the unit memory cells of the memory cell array one row at a time, a column decoder for sequentially activating the unit memory cells of the memory cell array one column at a time, a sense amplifier for amplifying a current value output from the column decoder, a buffer for storing a current value of an immediately previous cycle, the current value being amplified in the sense amplifier, a comparator for comparing the current value of the immediately previous cycle, which is stored in the buffer, to the present current value output from the sense amplifier, a write circuit for applying set and reset signals to the unit memory cells activated through the row decoder and the column decoder, and a control circuit for controlling operations of the buffer, the comparator, and the write circuit.

The buffer may provide the immediately previous current value stored therein in the immediately previous cycle to the comparator according to a control of the control circuit, and may simultaneously store the present current value for a comparison in a next cycle. The comparator may compare the immediately previous current value provided from the buffer and the present current value provided from the sense amplifier and then may provide a comparison result to the control circuit. During performing a reset operation, the control circuit may control the write circuit to apply again the reset voltage to the unit memory cell if a difference between a present reset current value and a set current value of the immediately previous cycle, which are compared to each other in the comparator, is smaller than a minimum value, may control the write circuit to apply again the reset voltage to the unit memory cell after applying a set voltage to the unit memory cell if the difference between the present reset current value and the set current value of the immediately previous cycle is larger than a maximum value.

During performing a set operation, the control circuit may control the write circuit to apply again the set voltage to the unit memory cell if a difference between a present set current value and a reset current value of the immediately previous cycle, which are compared to each other in the comparator, is smaller than a minimum value, and may control the write circuit to apply again the set voltage to the unit memory cell after applying a reset voltage to the unit memory cell if the difference between the present set current value and the reset current value of the immediately previous cycle is larger than a maximum value. The write circuit may include a pulse generator for generating a plurality of pulses for data writing, data reading, and data erasing in the memory cell array, and then for providing the plurality of pulses to the row decoder and the column decoder.

According to at least one example embodiment, a nonvolatile memory device includes a memory cell array including a plurality of unit memory cells arranged in a matrix shape including rows and columns, a row decoder configured to sequentially activate the unit memory cells of the memory cell array one row at a time, a column decoder configured to sequentially activate the unit memory cells of the memory cell array one column at a time, a sense amplifier configured to amplify current values output from the column decoder, a buffer configured to store a first current value of a first cycle, the first current value being amplified in the sense amplifier, a comparator configured to compare the first current value to a second current value of a second cycle immediately following the first cycle, the second current value output from the sense amplifier, a write circuit configured to apply set and reset signals to the unit memory cells activated by the row decoder and the column decoder and a control circuit configured to control operations of the buffer, the comparator, and the write circuit.

According to at least one example embodiment, a method of driving a nonvolatile memory device includes reading a first reset current in a first cycle, applying a first set voltage to a unit memory cell and reading a set current in a second cycle immediately following the first cycle, comparing the set current to the first reset current, applying a second set voltage to the unit memory cell if a difference between the set current and the first reset current is less than a minimum value, and applying a first reset voltage and a third set voltage sequentially to the unit memory cell if the difference is greater than a maximum value.

According to at least one example embodiment, a method of driving a nonvolatile memory device includes reading a first set current of a unit memory cell in a first cycle, applying a first reset voltage to the unit memory cell and reading a reset current in a second cycle immediately following the first cycle, comparing the reset current to the first set current, applying a second reset voltage to the unit memory cell if a difference between the reset current and the first set current is less than a minimum value, and applying a first set voltage and a third reset voltage sequentially to the unit memory cell if the difference is greater than a maximum value.

BRIEF DESCRIPTION OF THE DRAWINGS

Example embodiments will be more clearly understood from the following brief description taken in conjunction with the accompanying drawings.

FIG. 1 is a graph conceptually illustrating a series of reset operations in a nonvolatile memory device including a single level cell (SLC) according to at least one example embodiment;

FIG. 2 is a graph conceptually illustrating a series of reset operations in a nonvolatile memory device including a multi level cell (MLC) according to at least one example embodiment;

FIG. 3 is a flowchart illustrating a process of performing a reset operation according to at least one example embodiment;

FIG. 4 is a graph illustrating the process of performing the reset operation according to the flowchart of FIG. 3;

FIG. 5 is a graph conceptually illustrating a series of set operations in a nonvolatile memory device according to at least one example embodiment;

FIG. 6 is a flowchart illustrating a process of performing a set operation according to at least one example embodiment;

FIG. 7 is a graph illustrating a case where set and reset operations according to example embodiments are not applied to a nonvolatile memory device including an SLC;

FIG. 8 is a graph illustrating a case where set and reset operations according to example embodiments are applied to the nonvolatile memory device including an SLC;

FIG. 9 is a graph illustrating a case where set and reset operations according to example embodiments are not applied to a nonvolatile memory device including an MLC;

FIGS. 10 and 11 are graphs each showing a case where set and reset operations according to example embodiments are applied to a nonvolatile memory device including an MLC; and FIG. 12 is a block diagram illustrating a structure of a nonvolatile memory device according to example embodiments.

Figure 1:
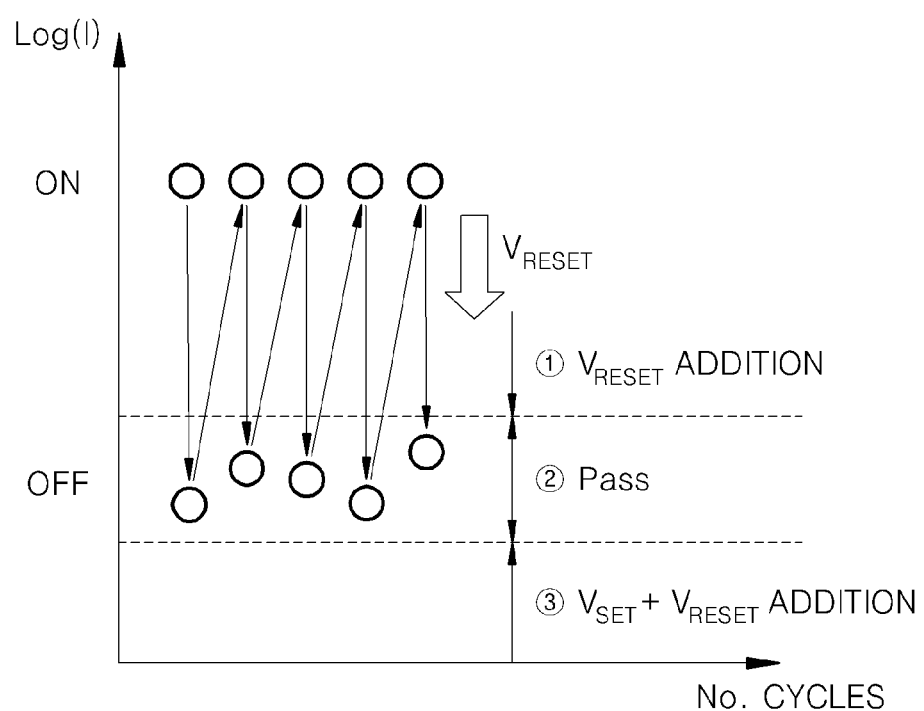
FIGS. 1-12 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A nonvolatile memory device, for example, a resistance-change memory device (RRAM), generally may use a binary oxide including various transition metals as a variable resistance material. The operation of the nonvolatile memory device may be performed by sequentially repeating a reset operation, a read operation, a set operation, and a read operation. The reset operation, the read operation, and the set operation may be embodied by applying a corresponding pulse signal (voltage) to the variable resistance material. It may be understood that the operation of the nonvolatile memory device may be performed by repeatedly applying pulse signals corresponding to the reset, read, and set operations, respectively, to a variable resistance material, for example.

The reliability of the nonvolatile memory device may be mainly determined by dispersions of ON current value and OFF current value that may be obtained during these repeated pulse cycles. The ON current value may be a current value (hereafter, referred to as ISET) that may be obtained when a read voltage may be applied to the variable resistance material after an application of a set voltage, and the OFF current value may be a current value (hereafter, referred to as IRESET) obtained when the read voltage may be applied to the variable resistance material after an application of a reset voltage. Dispersion characteristics of the current values may be factors for classifying levels "0" and "1" in a single level cell (SLC), and for classifying levels "00", "01", "10", and "11" in a multi level cell (MLC). It may be necessary to obtain constant current values, if possible, at each of the levels by suppressing dispersions of the current values at each of the levels, to improve the reliability of the nonvolatile memory device.

According to example embodiments, in order to improve dispersion characteristics of the current values, the reset voltage or set voltage may be additionally applied until the current values of each of the levels satisfy ranges.

FIG. 1 is a graph conceptually illustrating a series of reset operations in a nonvolatile memory device including a single level cell (SLC) according to at least one example embodiment. Referring to FIG. 1, a nonvolatile memory device may be switched between an ON state and an OFF state by using a repeated pulse cycle. According to at least one example embodiment, a current value of the OFF state may be read (using a read voltage) after switching from the ON state to the OFF state by applying the reset voltage $V_{RESET}$ to the variable resistance material in the ON state. A next cycle operation may be performed if the current value of the OFF state is within a range (refer to the operation ② "PASS" of FIG. 1).

The reset voltage may be applied again to the variable resistance material if the current value of the OFF state is larger than a target value (refer to the operation ① "$V_{RESET}$ ADDITION" of FIG. 1). In this case, the re-applied reset voltage may be, for example, equal to or lower than the original reset voltage $V_{RESET}$. Because the present resistance of the variable resistance material may be lower than a target resistance, a resistance of the variable resistance material may be changed closer to the target resistance although a reset voltage lower (e.g., a little lower) than the original reset voltage is applied to the variable resistance material.

If the current value of the OFF state is smaller than the target value, the reset voltage may be applied again to the variable resistance material after changing from the OFF state to the ON state by applying the set voltage to the variable resistance material (refer to the operation ③ "$V_{SET}+V_{RESET}$ ADDITION" of FIG. 1). In this case, because the present resistance of the variable resistance material may be higher than the target resistance, the re-applied set voltage may be equal to or larger than the original set voltage $V_{SET}$. In this manner, the operation ① "$V_{RESET}$ ADDITION" or the operation ③ "$V_{SET}+V_{RESET}$ ADDITION" may be repeated until the current value of the OFF state lies within a desired range.

According to at least one example embodiment, a current value may be compared to a prior current value of an immediately previous cycle to determine whether the current value is within a target range. For example, when the reset operation is performed, a current value ISET of an immediately previous ON state and a current value IRESET of the present OFF state may be compared to each other. When the set operation is performed, a current value IRESET of an immediately previous OFF state and a current value ISET of the present ON state may be compared to each other.

Figure 2:
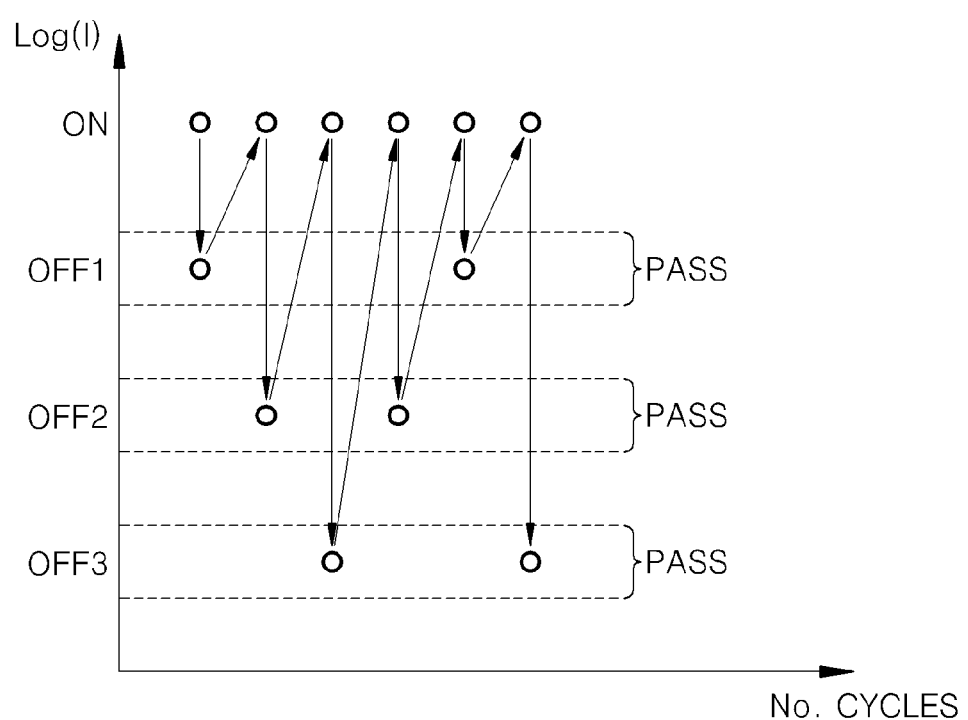

FIG. 2 is a graph conceptually illustrating a series of reset operations in a nonvolatile memory device including a multi level cell (MLC) according to at least one example embodiment. Referring to FIG. 2, the nonvolatile memory device may be switched from an ON state, in which information "00" may be recorded, to one of three OFF states (for example, an OFF1 state in which information "01" may be recorded, an OFF2 state in which information "10" may be recorded, and an OFF3 state in which information "11" may be recorded) depending on a level of the reset voltage, and then may be switched again to the ON state by applying the set voltage.

Similar to the operation of the SLC, in the repeated pulse cycles, the operation ① "$V_{RESET}$ ADDITION" or the operation ③ "$V_{SET}+V_{RESET}$ ADDITION" may be repeated until the current value of the OFF state lies within a target range. For example, in the case where the ON state is switched to the OFF1 state, an operation of a next cycle may be performed if a current value $I_{RESET1}$ measured in the OFF1 state is in a desired range. A reset voltage $V_{RESET1}$ of the OFF1 state may be applied again to the variable resistance material if the current value $I_{RESET1}$ measured in the OFF1 state is larger than the desired range, and the reset voltage $V_{RESET1}$ may be applied again to the variable resistance material after applying the set voltage $V_{SET}$ to the variable resistance material if the current value $I_{RESET1}$ is smaller than the desired range.

Figure 3:
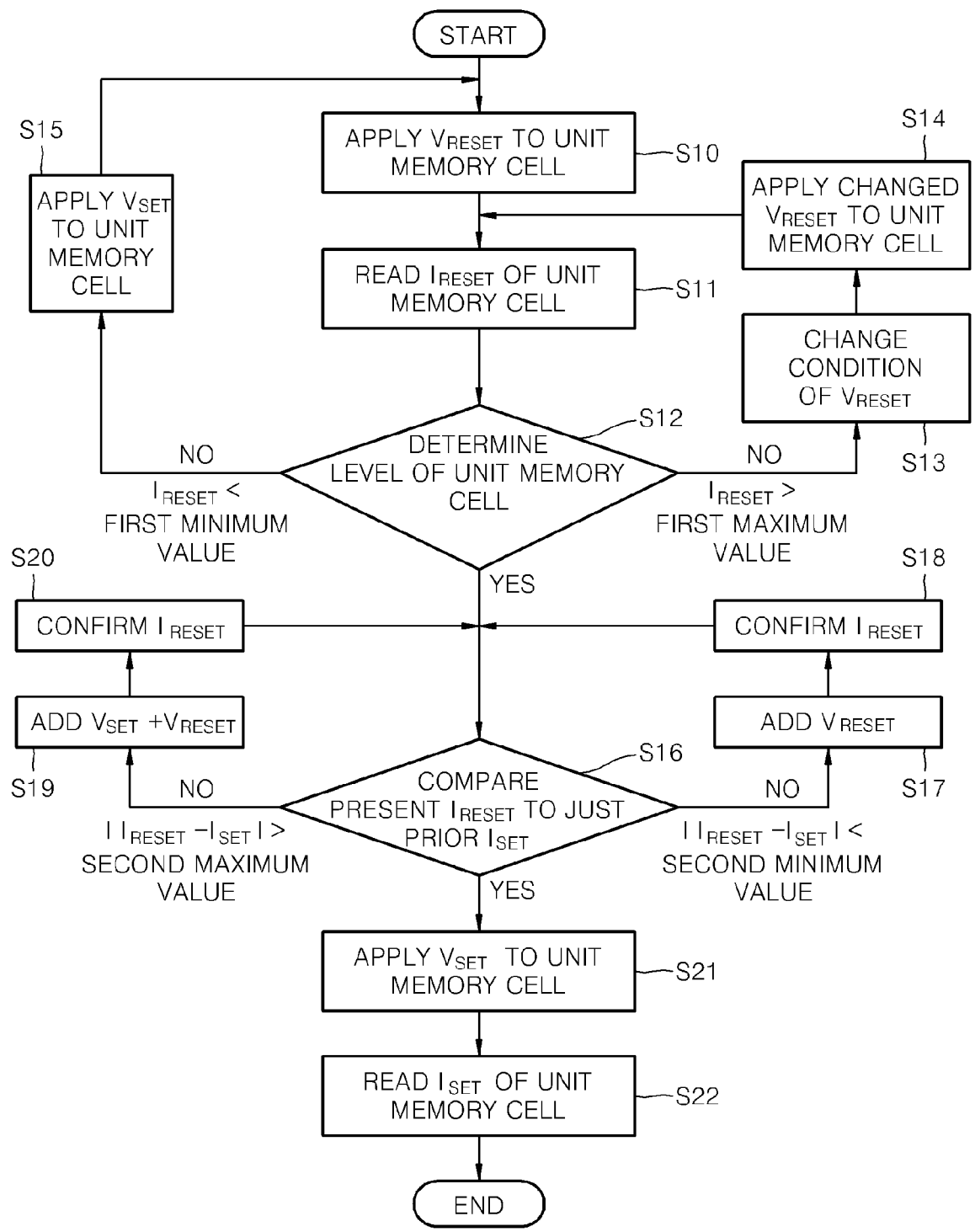
Figure 4:
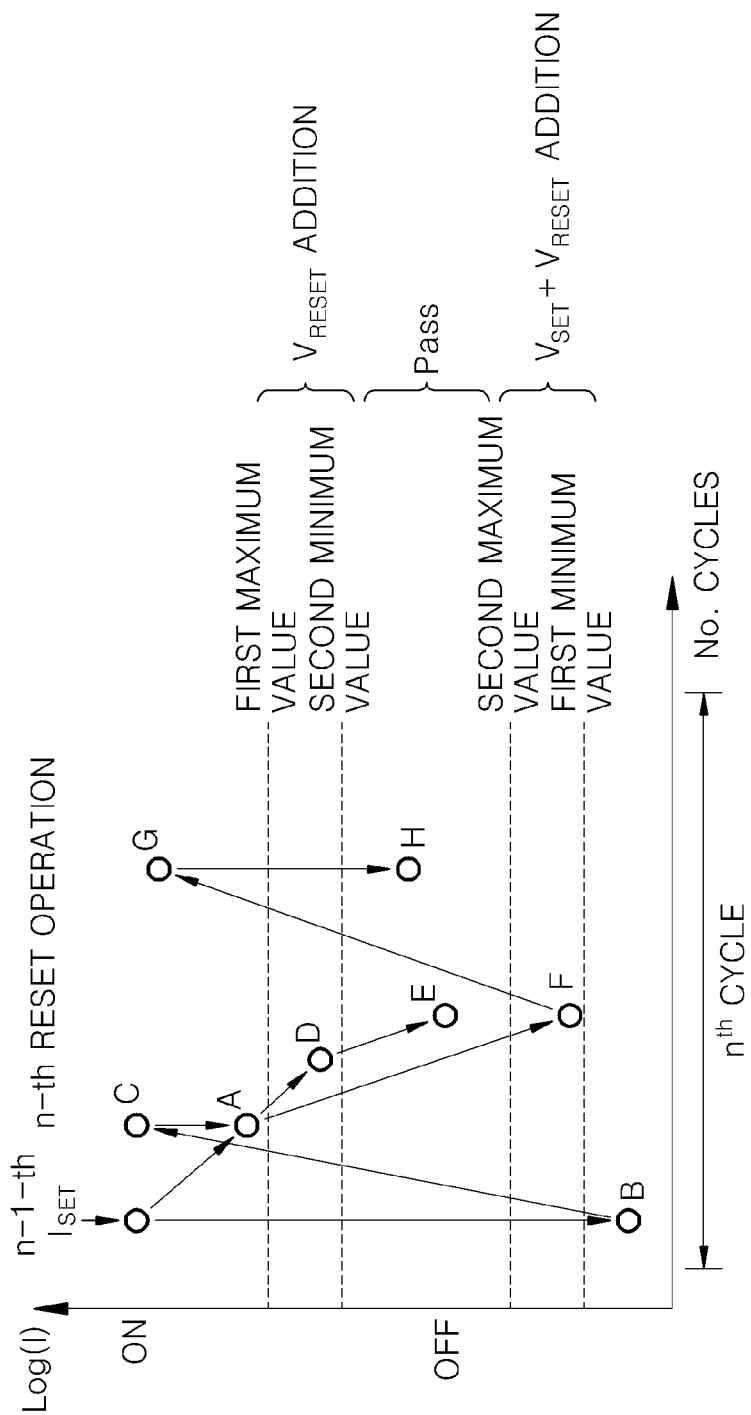

FIG. 3 is a flowchart illustrating a process of performing a reset operation according to at least one example embodiment. FIG. 4 is a graph illustrating the process of performing the reset operation according to the flowchart of FIG. 3. Referring to FIG. 3, a reset voltage $V_{RESET}$ may be applied to a variable resistance material in a unit memory cell (Operation S10). The reset voltage $V_{RESET}$ may be fixed if the unit memory cell is a SLC, but one of three different reset voltages may be selected and then applied to the variable resistance material depending on an OFF state to be moved, from among three OFF states, if the unit memory cell may is a MLC.

For example, a first reset voltage $V_{RESET1}$ may be applied to the variable resistance material in the case where a movement to the OFF1 state, in which information "01" is recorded, may be desired, and a second reset voltage $V_{RESET2}$ (not illustrated) larger than the first reset voltage $V_{RESET1}$ may be applied to the variable resistance material in the case where a movement to the OFF2 state, in which information "10" is recorded, may be desired. A third reset voltage $V_{RESET3}$ (not illustrated) larger than the second reset voltage $V_{RESET2}$ may be applied to the variable resistance material if a change to the OFF3 state, in which information "11" is recorded, may be desired.

The present reset current value $I_{RESET}$ may be read from the unit memory cell (Operation S11). It may be determined whether the present reset current value $I_{RESET}$ read from the unit memory cell is within a first current value range corresponding to a desired level, to determine whether the unit memory cell is switched to the desired level (Operation S12).

The first current value range may be changed depending on three OFF states, namely the OFF1, OFF2, and OFF3 states. For example, if the present reset current value $I_{RESET}$ is larger than a first maximum value which may be the upper limit of the first current value range, the reset voltage may be changed (Operation S13) and then a changed reset voltage may be applied to the variable resistance material of the unit memory cell (Operation S14). Referring to FIG. 4, if a state of the unit memory cell is switched to a state "A" when the unit memory cell is switched from a set state of n-1-th cycle to a reset state of n-th cycle, the reset voltage may be adjusted and then applied again to the variable resistance material to switch the state of the unit memory cell to one of states "D", "E", and "F".

Because the present resistance of the variable resistance material may be lower than the target resistance, the reset voltage adjusted in the operation S13 may be equal to or lower than the original reset voltage $V_{RESET}$ applied to the variable resistance material in the operation S10, that is, a reset voltage that may be initially applied to the variable resistance material during the reset operation. For example, a voltage value that may be applied to the variable resistance material may be determined depending on a difference between the present reset current value $I_{RESET}$ and the first maximum value.

If the present reset current value $I_{RESET}$ is smaller than a first minimum value which may be the lowest limit of the first current value range, the reset current value $I_{RESET}$ does not increase although only the reset voltage may be applied again to the variable resistance material. The reset voltage may be applied again to the variable resistance material (Operation S10) after switching the state of the unit memory cell to the set state by applying the set voltage to the variable resistance material (Operation S15).

For example, referring to FIG. 4, if the state of the unit memory cell is switched to a state "B" when the unit memory cell is switched from a set state of n-1-th cycle to a reset state of n-th cycle, the reset voltage may be applied again to the variable resistance material after switching the state of the unit memory cell to a state "C" by applying the set voltage to the variable resistance material. Because the present resistance of the variable resistance material may be higher than the target resistance, the set voltage applied to the variable resistance material in the operation S15 may be equal to or larger than the original set voltage $V_{SET}$, that is, a set voltage that may be initially applied to the variable resistance material of the unit memory cell during the set operation. For example, the set voltage applied to the variable resistance material in the operation S15 may be determined depending on a difference between the reset current value $I_{RESET}$ and the first minimum value.

The operations S10-S15 may be repeated until the state of the unit memory cell is switched to one of states "D", "E", and "F". The above-stated operations S12-S15, which may determine whether the state of the unit memory cell reach a desired level, may be applied only to the case where the unit memory cell is an MLC. In the case where the unit memory cell is an SLC, the operations S12-S15 may be omitted. The first current value range, the first maximum value, and the first minimum value may be changed depending on a structure and material of the nonvolatile memory device, and may be values predetermined by measuring in advance.

After determining whether the state of the unit memory cell reaches the desired level, in order to make a separation between a level and an adjacent level clearer by improving the dispersions, it may be confirmed whether the present reset current value $I_{RESET}$ is within another current value range narrower than the first current value range. For this, according to at least one example embodiment, the present reset current value $I_{RESET}$ and the set current value $I_{SET}$ of a just prior set state may be compared to each other (Operation S16). If a difference between the present reset current value $I_{RESET}$ and the set current value $I_{SET}$ of the just prior set state is in a second current value range, it may be determined that the state of the unit memory cell is accurately switched. The immediately previous set current value $I_{SET}$ may be read, for example, in an immediately previous set cycle and then stored in a buffer of the nonvolatile memory device.

If the difference $|I_{RESET}-I_{SET}|$ between the present reset current value $I_{RESET}$ and the set current value $I_{SET}$ of the immediately previous set state is smaller than a second minimum value which may be the lowest limit of the second current value range (for example, where a reset state is "D" in FIG. 4), the reset voltage may be applied again to the unit memory cell until the difference $|I_{RESET}-I_{SET}|$ lies within the second current value range (for example, a state indicated as "E" in FIG. 4) (Operation S17), and then a changed present reset current value $I_{RESET}$ may be confirmed again (Operation S18). The reset voltage applied in the operation S17 may be equal to or lower than the original reset voltage applied in the operation S10. According to at least one example embodiment, a width of the reset voltage adjusted in the operation S17 may be smaller than that of the reset voltage adjusted in the operation S13 for level-determining.

If the difference $|I_{RESET}-I_{SET}|$ is larger than a second maximum value which may be the upper limit of the second current value range (for example, where a reset state is "F" in FIG. 4), the reset current value $I_{RESET}$ may not increase anymore although the reset voltage may be applied again to the variable resistance material. After switching the state of the unit memory cell to the set state (a state indicated as "G" in FIG. 4) by applying the set voltage to the variable resistance material, the reset voltage may be applied again to the variable resistance material of the unit memory cell (Operation S19) so that the difference $|I_{RESET}-I_{SET}|$ lies within the second current value range (for example, a state indicated as "H" in FIG. 4), and then a changed present reset current value $I_{RESET}$ may be confirmed again (Operation S20). The set voltage applied in the operation S19 may be equal to or larger than the original set voltage $V_{SET}$, that is, a set voltage that may be initially applied during the set operation (not illustrated).

In the case of an MLC, the maximum and minimum values of the second current value range may be changed depending on the three OFF states. For example, maximum and minimum values of the second current value range (e.g., the range for the difference in currents) for the OFF1 may be smaller than those of the second current value range for the OFF2 state, and maximum and minimum values of the second current value range for the OFF2 state may be smaller than those of the second current value range for the OFF3 state. The second current value range and the second maximum and minimum values also may be changed depending on the structure and material of the nonvolatile memory device, and may be values determined experimentally in advance.

The set voltage may be applied to the unit memory cell in a next n+1-th cycle (Operation S21), and a next cycle operation (Operation S22) in which the set current value $I_{SET}$ is read from the unit memory cell may be continued. The principles of example embodiments may be applied also to the set operation as well as the reset operation.

Figure 5:
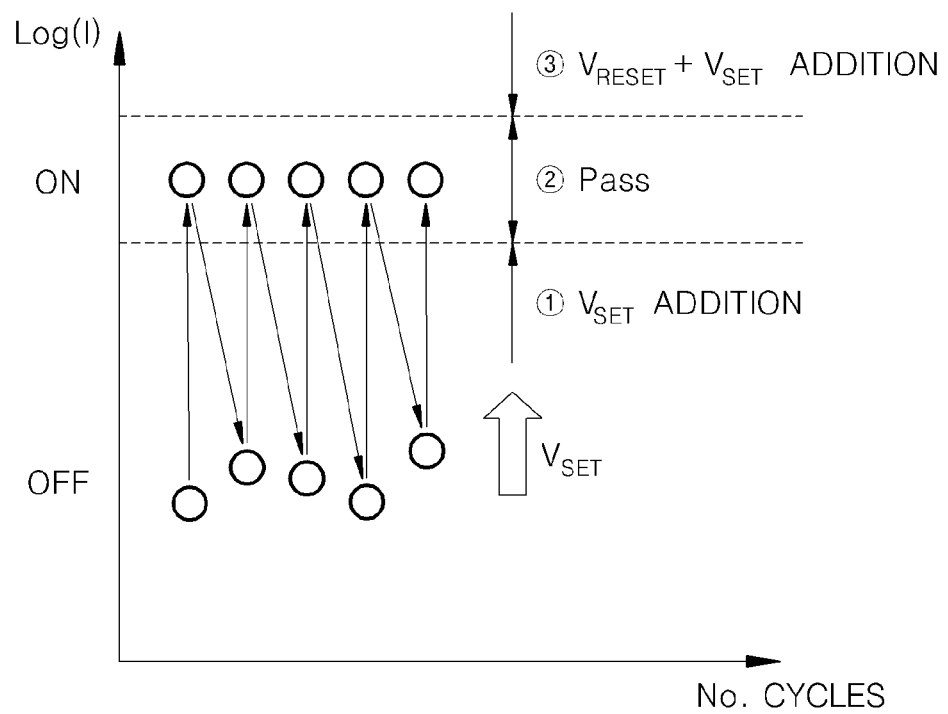

FIG. 5 is a graph conceptually illustrating a series of set operations in a nonvolatile memory device according to at least one example embodiment. Referring to FIG. 5, a nonvolatile memory device may be switched between an OFF state and an ON state by repeated pulse cycles. According to at least one example embodiment, a current value of the ON state may be read (e.g., by applying a read voltage) after switching from the OFF state to the ON state by applying a set voltage $V_{SET}$ to the variable resistance material in the OFF state. A next cycle operation may be performed if the current value of the ON state is within a desired range (refer to the operation ② "PASS" of FIG. 5).

The set voltage may be applied again to the variable resistance material if the current value of the ON state is smaller than a target value (refer to the operation ①"$V_{SET}$ ADDITION" of FIG. 5). Because the present resistance of the variable resistance material may be a little higher than a target resistance, the re-applied set voltage may be equal to or lower than the original set voltage $V_{SET}$. For example, a value of the re-applied set voltage may be determined depending on a difference between the present current value and a target current value.

If the current value of the ON state is larger than the target range, the set voltage may be applied again to the variable resistance material after changing from the ON state to the OFF state by applying the reset voltage to the variable resistance material (refer to the operation ③ "$V_{RESET}+V_{SET}$ ADDITION" of FIG. 5). In this case, because the present resistance of the variable resistance material may become very low, the re-applied reset voltage may be equal to or larger than the original reset voltage $V_{RESET}$, that is, a reset voltage that may be initially applied during the reset operation. In this manner, the operation ① "$V_{SET}$ ADDITION" or the operation ③ "$V_{RESET}+V_{SET}$ ADDITION" may be repeated until the current value of the ON state lies within a desired range.

Figure 6:
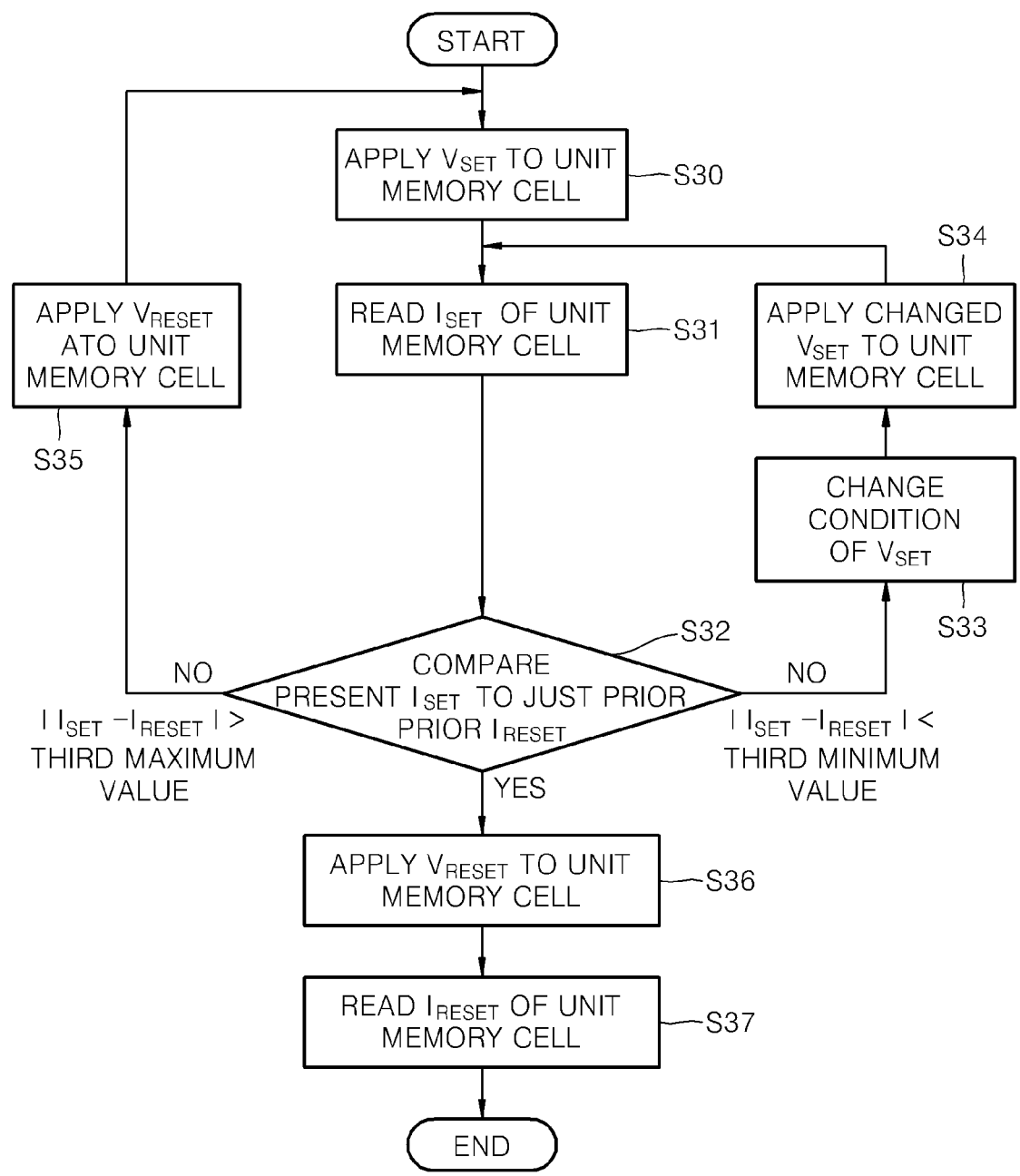

FIG. 6 is a flowchart illustrating a process of performing a set operation according to at least one example embodiment. Referring to FIG. 6, a set voltage $V_{SET}$ may be applied to a variable resistance material in a unit memory cell (Operation S30). The present set current value $I_{SET}$ may be read from the unit memory cell (Operation S31). In order to make a separation between adjacent levels clearer by improving the dispersions, it may be confirmed whether the present set current value $I_{SET}$ is within a target current value range. According to at least one example embodiment, the present set current value $I_{SET}$ and a reset current value $I_{RESET}$ of an immediately previous reset state may be compared to each other (Operation S32). If a difference between the present set current value $I_{SET}$ and the reset current value $I_{RESET}$ of the immediately previous reset state is in a third current value range, it may be determined that the state of the unit memory cell is accurately switched to a set state. The immediately previous reset current value $I_{RESET}$ may be read, for example, at an immediately previous reset cycle and then stored in a buffer of the nonvolatile memory device.

If a difference $|I_{SET}-I_{RESET}|$ between the present set current value $I_{SET}$ and the just prior reset current value $I_{RESET}$ is smaller than a third minimum value which may be the lowest limit of the third current value range, the set voltage may be changed (Operation S33) and then a changed set voltage may be applied again to the unit memory cell (Operation S34). Because the present resistance of the resistance change material may be higher (e.g., a little higher) than the target resistance, the re-applied set voltage may be equal to or lower than the original set voltage $V_{SET}$, that is, a set voltage that may be initially applied during the set operation. For example, a value of the re-applied set voltage may be determined depending on a difference between the present current value and a target current. The above-stated operations S31-S34 may be repeated until the difference $|I_{SET}-I_{RESET}|$ between the present set current value $I_{SET}$ and the just prior reset current value $I_{RESET}$ lies within the third current value range.

If the difference $|I_{SET}-I_{RESET}|$ is larger than a third maximum value which may be the upper limit of the third current value range, the set current value $I_{SET}$ may not decrease although the set voltage may be applied again to the variable resistance material. After switching the state of the unit memory cell to the reset state by applying the reset voltage to the variable resistance material (Operation S35), the set voltage may be applied again to the variable resistance material of the unit memory cell (Operation S30) so that the difference $|I_{SET}-I_{RESET}|$ may lie within the third current value range. Because the present resistance of the variable resistance material may become very low, the re-applied reset voltage may be equal to or larger than the original reset voltage $V_{RESET}$, that is, a reset voltage that may be initially applied during the reset operation.

If the difference $|I_{SET}-I_{RESET}|$ between the present set current value $I_{SET}$ and the just prior reset current value $I_{RESET}$ lies within the third current value range through the above-stated operations, the reset voltage may be applied to the unit memory cell in a next cycle (Operation S36), and a next cycle operation (Operation S37) in which the reset current value $I_{RESET}$ may be read from the unit memory cell may be continued. In the case of a MLC, the maximum and minimum values of the third current value range may be changed depending on the immediately previous reset state.

For example, maximum and minimum values of the third current value range in an immediately previous OFF1 state may be smaller than those of the third current value range in an immediately previous OFF2 state, and maximum and minimum values of the third current value range in the immediately previous OFF2 state may be smaller than those of the third current value range in an immediately previous OFF3 state. The third current value range and the third maximum and minimum values also may be changed depending on the structure and material of the nonvolatile memory device, and may be a value determined experimentally in advance. According to at least one example embodiment, the third current value range and the second current value range may be equally set at the same level. For example, the second current value range of when the unit memory cell may be switched from the set state to the reset state of "10" level and the third current value range of when the unit memory cell may be switched from the reset state of "10" level to the set state of "00" level may be equal to each other.

Various technologies may fix the set current value $I_{SET}$ without dispersion in the ON state by improving the material and structure of the variable resistance material inside the nonvolatile memory device. However, the dispersion of the reset current value $I_{RESET}$ in the OFF state may be still relatively large. In the case of combining a technology of uniformly fixing the set current value and a driving method according to example embodiments, the reset current value $I_{RESET}$ compared to the set current value $I_{SET}$ also may be almost fixed without dispersion within a target range (for example, within the second current range) because the set current value $I_{SET}$ may be uniformly fixed. As a result, the dispersion of the current values may be largely improved regardless of the ON state and the OFF state.

Figure 7:
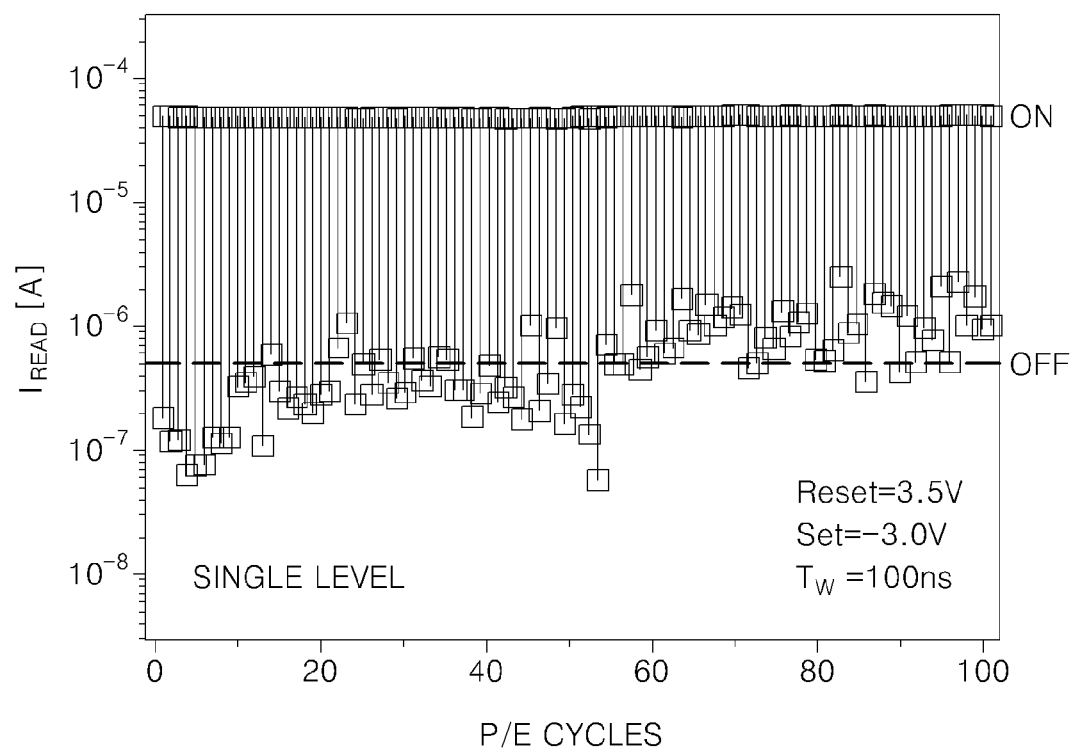
Figure 8:
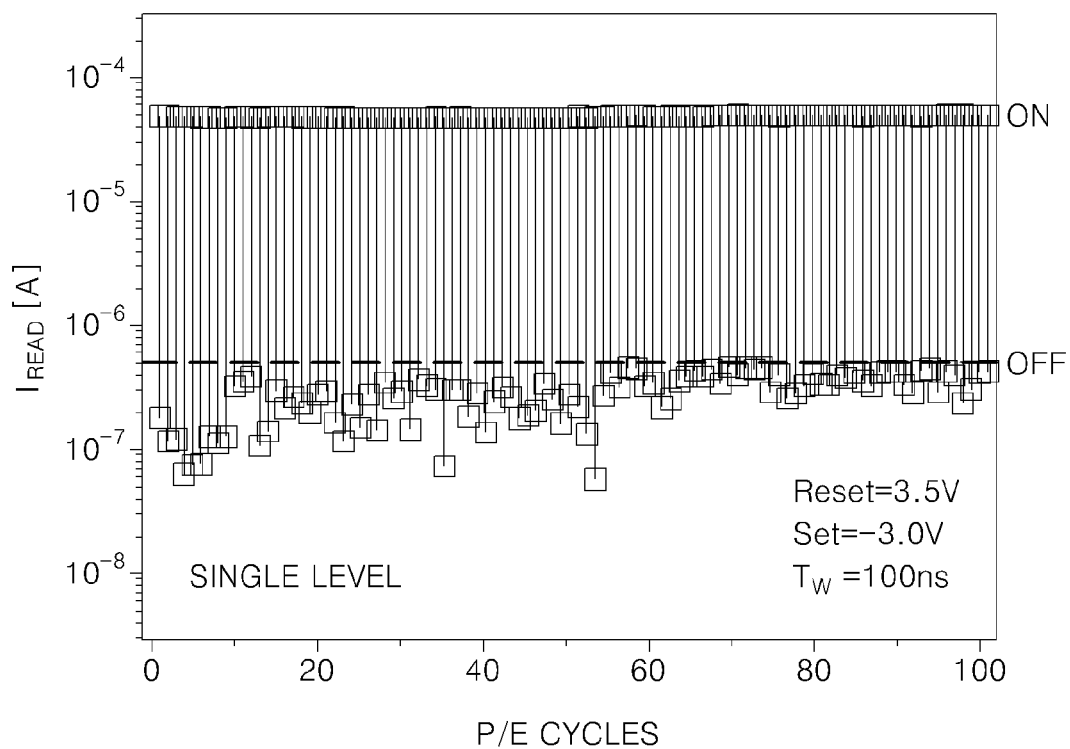

FIG. 7 is a graph illustrating a case where set and reset operations according to example embodiments are not applied to a nonvolatile memory device including an SLC. FIG. 8 is a graph illustrating a case where set and reset operations according to example embodiments are applied to the nonvolatile memory device including an SLC. In program/erase (P/E) cycles, in which the set operation and the reset operation may be repeated, illustrated in FIGS. 7 and 8, the reset voltage may be 3.5 volts, the set voltage may be −3.0 volts, and a period of time (a pulse width) when each voltage is applied may be 100 nanoseconds. Referring to FIG. 7, a sensing fail may easily occur since the current value dispersion may be not suppressed in the OFF state. On the contrary, the graph of FIG. 8 may illustrate the case where only minimum value may be set so that a difference between an immediately previous set current value $I_{SET}$ and the present reset current value $I_{RESET}$ may satisfy a condition "$\log(|I_{SET}-I_{RESET}|)>2.5$". Referring to FIG. 8, sensing fail may not occur because, in the OFF state, the current value may always be lower than a reference current value that may be indicated via a dotted line.

Figure 9:
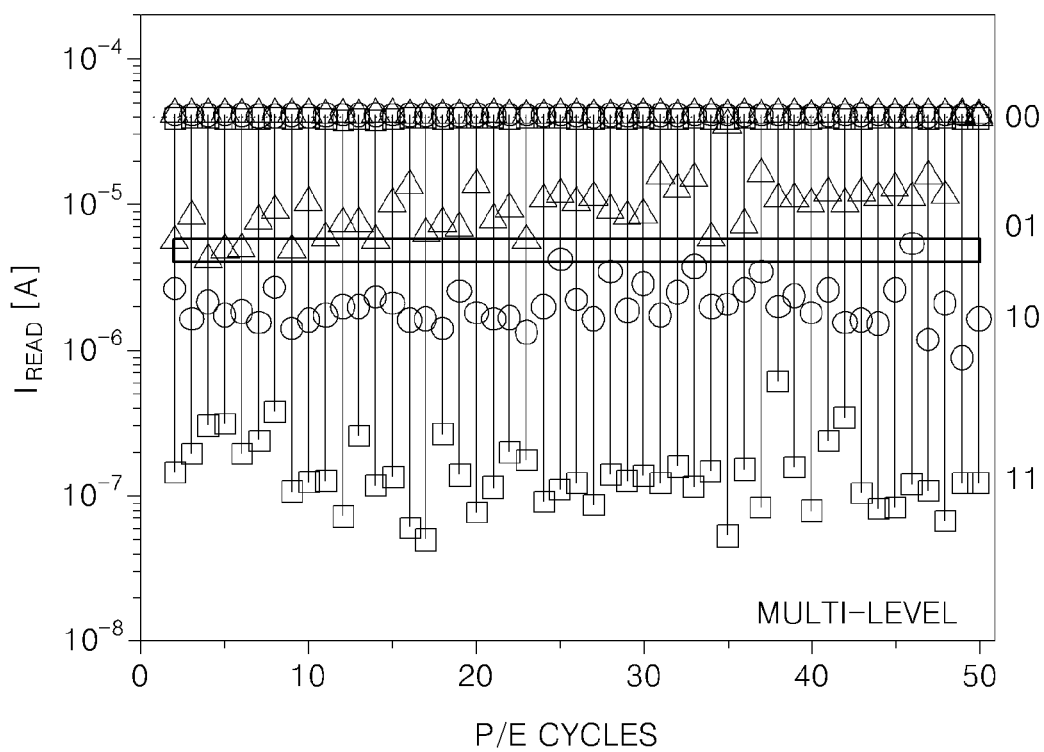
Figure 10:
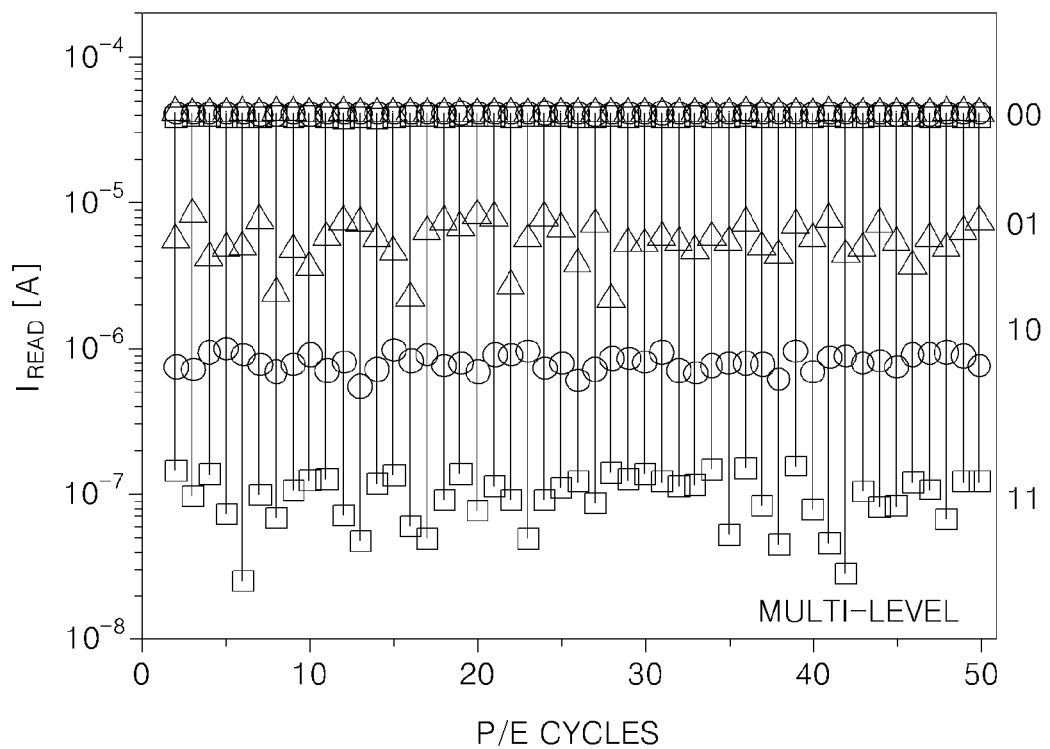
Figure 11:
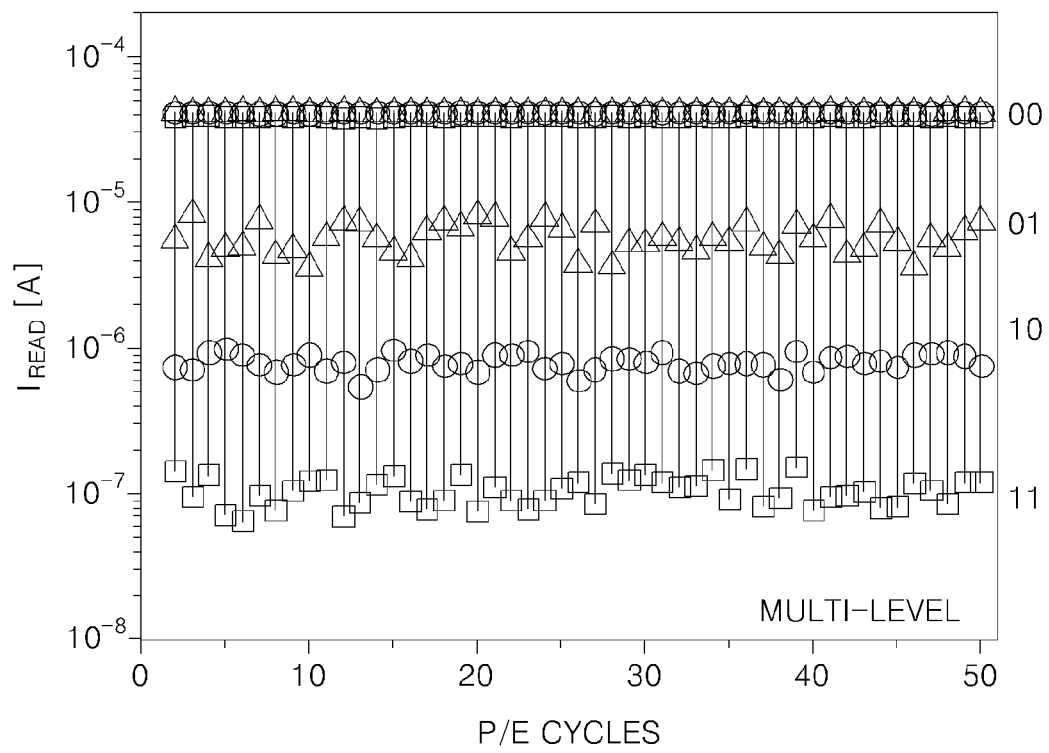

FIG. 9 is a graph illustrating a case where set and reset operations according to example embodiments are not applied to a nonvolatile memory device including an MLC. FIGS. 10 and 11 are graphs each showing a case where set and reset operations according to example embodiments are applied to a nonvolatile memory device including an MLC. Referring to FIG. 9, it may be difficult to separate the levels from each other due to a current value dispersion of each level. In particular, as indicated by a box in FIG. 9, level "01" and level "10" may not be separated from each other. On the contrary, the graph of FIG. 10 illustrates, for example, a case where only the minimum value may be set so that a difference between an immediately previous set current value $I_{SET}$ and the present reset current value $I_{RESET}$ may satisfy a condition "$\log(|I_{SET}-I_{RESET}|)>2.5$". In the case of FIG. 10, it may be easy to separate the levels from each other compared to the case of FIG. 9. The graph of FIG. 11 illustrates a case where both of the minimum value and the maximum value are set to satisfy a condition "$3.5>\log(|I_{SET}-I_{RESET}|)>2.5$". Referring to FIG. 11, it may be easier to separate the levels from each other due to a further reduction of the dispersion at each level.

Figure 12:
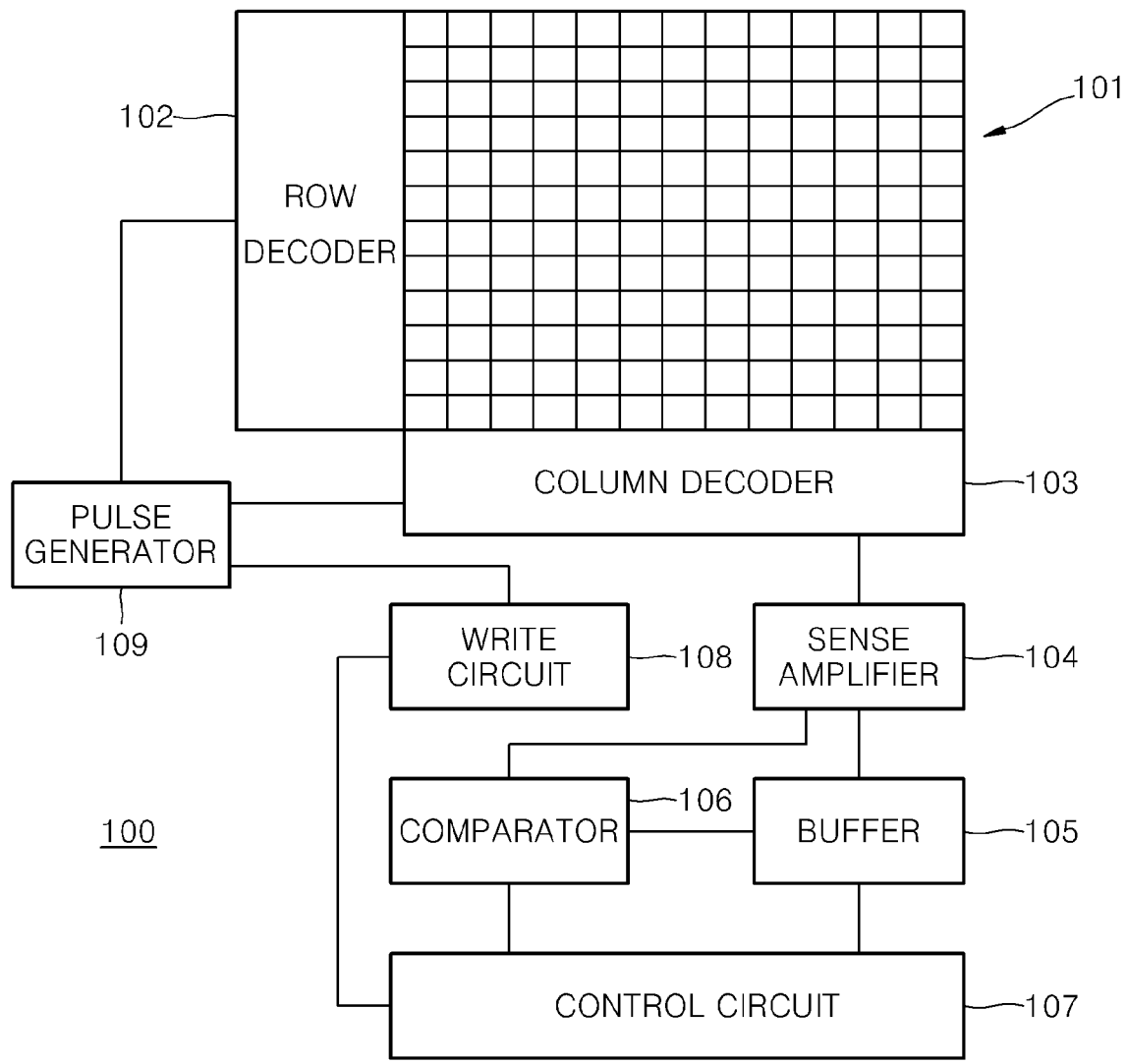

FIG. 12 is a block diagram illustrating a structure of a nonvolatile memory device 100 embodying the set and reset operations according to example embodiments. Referring to FIG. 12, the nonvolatile memory device 100 may include a memory cell array 101, a row decoder 102, a column decoder 103, a sense amplifier 104, a buffer 105, a comparator 106, a write circuit 108 and a control circuit 107. The memory cell array 101 may include a plurality of unit memory cells arranged in a matrix including rows and columns. The row decoder 102 may sequentially activate the unit memory cells of the memory cell array 101 one row at a time. The column decoder 103 may sequentially activate the unit memory cells of the memory cell array 101 one column at a time. The sense amplifier 104 may amplify a current value output from the column decoder 103. The buffer 105 may store a current value of an immediately previous cycle, which may be amplified in the sense amplifier 104. The comparator 106 may compare the current value of the immediately previous cycle, which may be stored in the buffer 105, to the present current value output from the sense amplifier 104. The write circuit 108 may apply set and reset signals to the unit memory cells activated through the row decoder 102 and the column decoder 103. The control circuit 107 may control operations of the buffer 105, the comparator 106, and the write circuit 108. The write circuit 108 may include a pulse generator 109 for generating a plurality of pulses for data writing, data reading, and data erasing in the memory cell array 101, and for providing the plurality of pulses to the row decoder 102 and the column decoder 103.

For example, during a reset operation, the row decoder 102 may activate a row of the memory cell array 101. The column decoder 103 may apply the reset signal to the unit memory cells while activating one column at a time of the unit memory cells in the activated row, and may read a current value of the OFF state. The reset signal may be generated by the pulse generator 109 according to a control of the write circuit 108. The current value read by the column decoder 103 may be amplified and verify-read by the sense amplifier 104 and then may be provided to the comparator 106 and the buffer 105. The buffer 105 may provide the immediately previous current value that may be stored therein in the immediately previous cycle to the comparator 106 according to a control of the control circuit 107, and simultaneously may store the present current value for a comparison in a next cycle. The comparator 106 may compare the immediately previous current value provided from the buffer 105 to the present current value that may be provided from the sense amplifier 104 and then may provide a comparison result to the control circuit 107.

The control circuit 107 may perform a driving method according to the example embodiments described with respect to FIGS. 1-11. For example, as a comparison result in the reset operation, if a difference between the present reset current value and the immediately previous set current value in a unit memory cell is excessively large, the control circuit 107 may control the write circuit 108 to sequentially apply again the set voltage and the reset voltage to the unit memory cell. If the difference between the present reset current value and the immediately previous set current value in a unit memory cell is excessively small, the control circuit 107 may control the write circuit 108 to apply again the reset voltage to the unit memory cell.

As a comparison result in the set operation, if a difference between the present set current value and the immediately previous reset current value in a unit memory cell is excessively large, the control circuit 107 may control the write circuit 108 to sequentially apply again the reset voltage and the set voltage to the unit memory cell. If the difference between the present set current value and the immediately previous reset current value in a unit memory cell is excessively small, the control circuit 107 may control the write circuit 108 to apply again the set voltage to the unit memory cell.

While example embodiments have been particularly shown and described, it will be understood by one of ordinary skill in the art that variations in form and detail may be made therein without departing from the spirit and scope of the claims.

What is claimed is:

1. A method of driving a nonvolatile memory device, the method comprising:
    reading a first set current of a unit memory cell in a first cycle;
    applying a first reset voltage to the unit memory cell and reading a reset current in a second cycle immediately following the first cycle;
    comparing the reset current to the first set current;
    applying a second reset voltage to the unit memory cell if a difference between the reset current and the first set current is less than a minimum value; and
    applying a first set voltage and a third reset voltage sequentially to the unit memory cell if the difference is greater than a maximum value.

2. The method of claim 1, further comprising:
    applying a second set voltage to the unit memory cell and reading a second set current in a third cycle if a difference between a reset current of the second cycle and the first set current is within a current value range.

3. The method of claim 1, further comprising:
    determining whether the unit memory cell is switched to a target state after the applying a first reset voltage and the reading a reset current, and before the comparing the reset current.

4. The method of claim 3, further comprising:
    selecting the first reset voltage from among at least three different reset voltages based on the target state, the at least three different reset voltages corresponding to different states of the unit memory cell.

5. The method of claim 3, wherein the determining includes determining whether the reset current is within a current value range corresponding to the target state.

6. The method of claim 5, further comprising:
applying a fourth reset voltage to the unit memory cell if the reset current exceeds a maximum value of the current value range.

7. The method of claim 6, wherein the fourth reset voltage is less than or equal to the first reset voltage.

8. The method of claim 5, further comprising:
applying a second set voltage and a fourth reset voltage sequentially to the unit memory cell if the reset current is less than a minimum value of the current value range.

9. The method of claim 1, wherein the comparing the reset current to the first set current includes determining whether a difference between the reset current and the first set current is within a target current value range selected from among three different current value ranges, each of the current value ranges corresponding to a state of the unit memory cell.

10. The method of claim 1, further comprising:
storing a value corresponding to the first set current in a buffer after the reading a first set current.

11. The method of claim 1, wherein the second reset voltage is less than or equal to the first reset voltage.

12. A method of driving a nonvolatile memory device, the method comprising:
reading a first reset current in a first cycle;
applying a first set voltage to a unit memory cell and reading a set current in a second cycle immediately following the first cycle;
comparing the set current to the first reset current;
applying a second set voltage to the unit memory cell if a difference between the set current and the first reset current is less than a minimum value; and
applying a first reset voltage and a third set voltage sequentially to the unit memory cell if the difference is greater than a maximum value.

13. The method of claim 12, further comprising:
applying a second reset voltage to the unit memory cell and reading a second reset current in a third cycle if the difference is within a current value range.

14. The method of claim 12, wherein the comparing includes determining whether the difference is within a target current value range selected from among three different current value ranges depending on a state of the unit memory cell in the first cycle, each of the three different current value ranges corresponding to a different state of the unit memory cell.

15. The method of claim 12, wherein the second set voltage is less than or equal to the first set voltage.

16. The method of claim 12, further comprising:
storing a value corresponding to the first reset current in a buffer after the reading a first reset current.

17. A nonvolatile memory device, comprising:
a memory cell array including a plurality of unit memory cells arranged in a matrix shape including rows and columns;
a row decoder configured to sequentially activate the unit memory cells of the memory cell array one row at a time;
a column decoder configured to sequentially activate the unit memory cells of the memory cell array one column at a time;
a sense amplifier configured to amplify current values output from the column decoder;
a buffer configured to store a first current value of a first cycle, the first current value being amplified in the sense amplifier;
a comparator configured to compare the first current value to a second current value of a second cycle immediately following the first cycle, the second current value output from the sense amplifier;
a write circuit configured to apply set and reset signals to the unit memory cells activated by the row decoder and the column decoder; and
a control circuit configured to control operations of the buffer, the comparator, and the write circuit.

18. The nonvolatile memory device of claim 17, wherein
the buffer is configured to provide the first current value to the comparator in the second cycle according to a control of the control circuit, and
to simultaneously store the second current value for comparison in a third cycle.

19. The nonvolatile memory device of claim 18, wherein
the comparator is configured to compare the first current value provided by the buffer and the second current value provided from the sense amplifier, and to provide a comparison result to the control circuit.

20. The nonvolatile memory device of claim 19, wherein, during a reset operation, the control circuit is configured to
control the write circuit to apply the reset signal twice in the second cycle to at least one of the unit memory cells if a difference between a reset current value of the second cycle and a set current value of the first cycle, which are compared to each other in the comparator, is less than a minimum value, and
control the write circuit to apply the reset signal twice in the second cycle to at least one of the unit memory cells after applying a set voltage to the unit memory cell if the difference is greater than a maximum value.

21. The nonvolatile memory device of claim 19, wherein, during a set operation, the control circuit is configured to
control the write circuit to apply the set signal twice in the second cycle to at least one of the unit memory cells if a difference between a set current value of the second cycle and a reset current value of the first cycle, which are compared to each other in the comparator, is less than a minimum value, and
control the write circuit to apply the set signal twice in the second cycle to at least one of the unit memory cells after applying a reset voltage to the unit memory cell if the difference between the set current value and the reset current value is larger than a maximum value.

22. The nonvolatile memory device of claim 17, wherein the write circuit includes a pulse generator configured to
generate a plurality of pulses, the plurality of pulses used to write data, read data, and erase data in the memory cell array, and
to provide the plurality of pulses to the row decoder and the column decoder.

* * * * *